United States Patent
Takeuchi et al.

(10) Patent No.: US 6,255,686 B1
(45) Date of Patent: Jul. 3, 2001

(54) SEMICONDUCTOR STORAGE DEVICE INCLUDING SHORT CIRCUIT AVOIDING STRUCTURE AND METHOD OF FABRICATING THEREOF

(75) Inventors: Hideki Takeuchi; Hirohiko Izumi, both of Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/124,852

(22) Filed: Jul. 30, 1998

(30) Foreign Application Priority Data

Dec. 2, 1997 (JP) ................................................. 9-347063

(51) Int. Cl.$^7$ ..................... H01L 27/108; H01L 29/76; H01L 29/94; H01L 31/119
(52) U.S. Cl. ..................... 257/306; 257/301; 257/308; 257/309; 257/318
(58) Field of Search ..................... 257/301–306, 257/308, 310, 309

(56) References Cited

U.S. PATENT DOCUMENTS

| | | | |
|---|---|---|---|
| 5,464,787 | * 11/1995 | Ryou | 437/52 |
| 5,478,768 | * 12/1995 | Iwasa | 437/52 |
| 5,569,948 | * 10/1996 | Kim | 257/382 |
| 5,792,692 | * 8/1998 | Li et al. | 438/253 |
| 5,869,861 | * 2/1999 | Chen | 257/308 |
| 6,031,262 | * 2/2000 | Sakao | 257/306 |
| 6,054,360 | * 4/2000 | Watanabe | 438/396 |

FOREIGN PATENT DOCUMENTS

| | | |
|---|---|---|
| 64-77170 | 3/1989 | (JP) . |
| 2-133924 | 5/1990 | (JP) . |
| 4-130722 | 5/1992 | (JP) . |
| 4-303942 | 10/1992 | (JP) . |
| 8-31928 | 2/1996 | (JP) . |

\* cited by examiner

*Primary Examiner*—Eddie C. Lee
*Assistant Examiner*—Jesse A. Fenty
(74) *Attorney, Agent, or Firm*—Connolly Bove Lodge & Hutz LLP

(57) ABSTRACT

In a semiconductor storage device, an access transistor, which has a gate electrode and a pair of impurity diffusion layers, is formed at a device activation region defined by a device isolation structure of a semiconductor substrate. A first insulating film, which has a first contact hole for exposing a portion of the surface of one of the pair of impurity diffusion layers, is formed over the access transistor. A protective film, which has a second contact hole formed on the first contact hole, is formed on the first insulating film. A second insulating film is formed on the side wall faces of the first and second contact holes. A memory capacitor has a lower electrode and an upper part electrode which are opposed each other and are capacitive-coupled through a dielectric film. The lower electrode is filled inside the first and second contact holes to be formed in an island-like shape on the first insulating film through the protective film so as to be electrically connected with the one of the pair of impurity diffusion layers. Each of the first and second contact holes has a diameter which is made smaller by an existence of the second insulating film than a minimum dimension determined by an exposure limit in a photolithography.

12 Claims, 15 Drawing Sheets

US 6,255,686 B1

SEMICONDUCTOR STORAGE DEVICE INCLUDING SHORT CIRCUIT AVOIDING STRUCTURE AND METHOD OF FABRICATING THEREOF

BACKGROUND OF THE INVENTION

1. Field of the Invention

The present invention relates to a semiconductor storage device and a method of fabricating thereof, and more particularly to a semiconductor storage device having a memory capacitor such as a DRAM, and a method of fabricating thereof.

2. Description of the Related Art

In recent years, semiconductor devices have been getting more and more microminiaturized and highly integrated. With this trend, resolution technique in the photolithography has already advanced to almost its exposure limit. Concerning mask alignment technique in the photolithography, however, much progress has not been made yet. Under such circumstances, indicated below are prior arts that disclose a semiconductor storage device which is designed to embody the high integration and the microminiaturization by using a microscopic contact hole, and a method of fabricating thereof.

(1) JP-A-2-133924

A silicon oxide film, a PSG film and a silicon nitride film, which have been formed one by one on a silicon substrate, are etched so as to form a contact hole. Then, a CVD silicon oxide film is deposited on the silicon nitride film so that the contact hole is buried. After that, an anisotropic etching of the CVD silicon oxide film is performed with the silicon nitride film as a stopper, thus forming a side wall on the sides of the contact hole and silicon nitride film. This makes it possible not only to decrease the diameter of the contact hole but also to eliminate protuberances on the side wall, thus allowing planarization of the surface to be accomplished.

(2) JP-A-4-130722

A first interlayer film, a second interlayer film and a silicon nitride film, which have been formed one by one on a silicon substrate, are etched so as to form a taper-shaped bit contact hole. Then, a CVD oxide film is deposited inside the bit contact hole and on the silicon nitride film. After that, the CVD oxide film on the silicon nitride film is etched with the silicon nitride film as a stopper, thereby forming a side wall which comprises the CVD oxide film inside the bit contact hole. At this time, the silicon nitride film is also etched. This makes it possible not only to decrease the diameter of the bit contact hole but also to prevent a reverse taper of the bit contact hole even if a film of no good step coverage is employed.

(3) JP-A-64-77170

A gate oxide film, a gate electrode, an interlayer insulating film and a high melting point metal silicide film are formed one by one on a p-type silicon substrate. The gate oxide film, the interlayer insulating film and the high melting point metal silicide film are etched so as to form a contact hole that is in contact with the gate electrode. Then, the side of the gate electrode exposed from the contact hole and the surface of the p-type silicon substrate exposed from the contact hole are oxidized so as to form an oxide film. A CVD oxide film is deposited on the high melting point metal silicide film so that the contact hole is buried. After that, an anisotropic etching of the CVD oxide film is performed by the time the surface of the high melting point metal silicide film is exposed, thus leaving the CVD oxide film only on the side wall of the contact hole. After that, an interconnection is formed on the high melting point metal silicide film so that the contact hole is buried. This makes it possible to form the interconnection self-consistently without developing a short-circuit with the gate electrode, and at the same time the high melting point metal silicide film, which lies under the interconnection, enables the reliability to be enhanced.

However, in trying to make the DRAM microminiaturized and highly integrated, the element the design rule of which is the severest is a storage contact hole for connecting a lower electrode (a storage node electrode) of the memory capacitor with a source (or a drain) of an access transistor. In particular, when forming a DRAM of COB (Capacitor Over Bitline) structure in which a bit line is formed under the lower electrode, it is required to form the storage contact hole in such a manner that there occur no short-circuits between the bit line and the lower electrode as well as between a word line (a gate electrode) and the lower electrode.

SUMMARY OF THE INVENTION

It is an object of the present invention to provide a semiconductor storage device that ensures enough alignment leeway in the photolithography and embodies formation of a lower electrode establishing no short-circuit with a word line or a bit line, thereby making it possible to embody a high reliability of a memory capacitor, and a method of fabricating thereof.

A first semiconductor storage device according to the present invention comprises: a semiconductor substrate having a device activation region defined by a device isolation structure; an access transistor formed at the device activation region in the semiconductor substrate, and having a gate electrode and a pair of impurity diffusion layers; a first insulating film formed above the access transistor, and having a first contact hole for exposing a portion of a surface of one of the pair of impurity diffusion layers; a protective film formed on the first insulating film, and having a second contact hole formed on the first contact hole; a second insulating film formed on side wall faces of the first and second contact holes; and a memory capacitor in which a lower electrode and an upper electrode are opposed to each other and capacitive-coupled through a dielectric film, wherein the lower electrode of the memory capacitor is filled inside the first and second contact holes to be formed in an island-like shape on the first insulating film through the protective film so as to be electrically connected with the one of the pair of impurity diffusion layers.

A second semiconductor storage device according to the present invention comprises: a semiconductor substrate having a device activation region defined by a device isolation structure; an access transistor formed at the device activation region in the semiconductor substrate, and having a gate electrode and a pair of impurity diffusion layers; a first insulating film formed above the access transistor, and having a contact hole for exposing a portion of a surface of one of the pair of impurity diffusion layers; a second insulating film formed on a side wall face of the contact hole in such a manner as to protrude from the contact hole; and a memory capacitor in which a lower electrode and an upper electrode are opposed to each other and capacitive-coupled through a dielectric film, wherein the lower electrode of the memory capacitor is filled inside the contact hole through the second insulating film to be formed in an island-like shape on the first insulating film so as to be electrically connected with the one of the pair of impurity diffusion layers.

A third semiconductor storage device according to the present invention comprises: a semiconductor substrate having a device activation region defined by a device isolation structure; an access transistor formed at the device activation region in the semiconductor substrate, and having a gate electrode and a pair of impurity diffusion layers; an insulating film formed above the access transistor, and having a first contact hole for exposing a portion of a surface of one of the pair of impurity diffusion layers; a protective film formed on the insulating film, and having a second contact hole formed on the first contact hole; a conducting film formed on a side wall face of the second contact hole in the protective film; and a memory capacitor in which a lower electrode and an upper electrode are opposed to each other and capacitive-coupled through a dielectric film, wherein the lower electrode of the memory capacitor is filled inside the first and second contact holes to be formed in an island-like shape on the insulating film through the protective film so as to be electrically connected with the one of the pair of impurity diffusion layers.

A first method of fabricating a semiconductor storage device according to the present invention is a method of fabricating a semiconductor storage device that comprises: a semiconductor substrate having a device activation region defined by a device isolation structure; an access transistor formed at the device activation region in the semiconductor substrate, and having a gate electrode and a pair of impurity diffusion layers; and a memory capacitor in which a lower electrode and an upper electrode are opposed to each other and capacitive-coupled through a dielectric film, comprises; a first step of forming a first insulating film above the access transistor; a second step of forming a protective film on the first insulating film; a third step of patterning the first insulating film and the protective film by means of a photolithography so as to form first and second contact holes for exposing a portion of a surface of one of the pair of impurity diffusion layers in the first insulating film and in the protective film, respectively; a fourth step of forming a second insulating film in a uniform film thickness or a homogeneous film thickness on side wall faces of the first and second contact holes and on a surface of the protective film; a fifth step of etching the second insulating film with the protective film as a stopper so as to leave the second insulating film only on the side wall faces of the first and second contact holes; a sixth step of forming a conducting film on the protective film so as to fill the first and second contact holes; and a seventh step of patterning the conducting film so as to form the lower electrode of the memory capacitor in an island-like shape on the protective film.

A second method of fabricating a semiconductor storage device according to the present invention is a method of fabricating a semiconductor storage device that comprises: a semiconductor substrate having a device activation region defined by a device isolation structure; an access transistor formed at the device activation region in the semiconductor substrate, and having a gate electrode and a pair of impurity diffusion layers; and a memory capacitor in which a lower electrode and an upper electrode are opposed to each other and capacitive-coupled through a dielectric film, and comprises: a first step of forming an insulating film above the access transistor; a second step of forming a protective film on the insulating film; a third step of patterning the protective film by means of a photolithography so as to form a first contact hole in the protective film; a fourth step of forming a first conducting film inside the first contact hole and on a surface of the protective film; a fifth step of etching the first conducting film with the protective film as a stopper so as to leave the first conducting film only on a side wall face of the first contact hole; a sixth step of etching the insulating film with the protective film as a mask, in which the first conducting film is left on the side wall face of the first contact hole, so as to form a second contact hole for exposing a portion of a surface of the one of the pair of impurity diffusion layers; a seventh step of forming a second conducting film on the protective film so as to fill the first and second contact holes; and an eighth step of patterning the second conducting film so as to form the lower electrode of the memory capacitor in an island-like shape on the protective film.

DESCRIPTION OF THE PREFERRED EMBODIMENTS (First Embodiment)

Figure 3A:
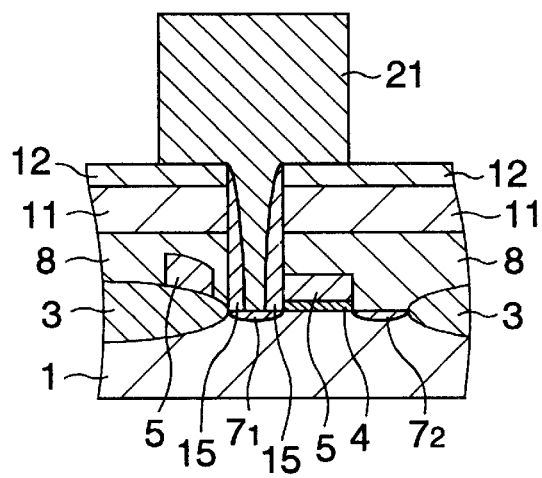
FIGS. 3A–3D are cross sectional views showing, in processing order, the method of fabricating the DRAM of COB 'structure which is the semiconductor storage device according to the first embodiment of the present invention.
Figure 3B:
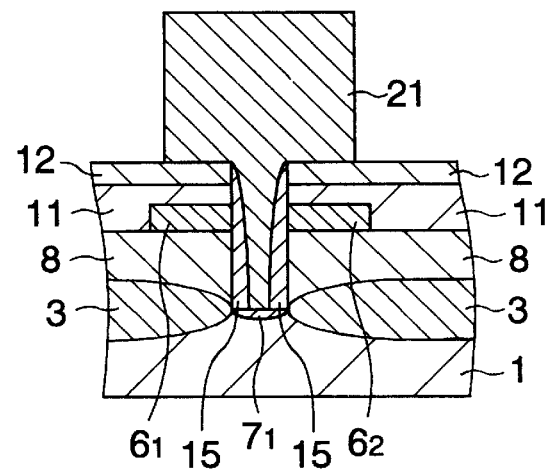
Figure 3C:
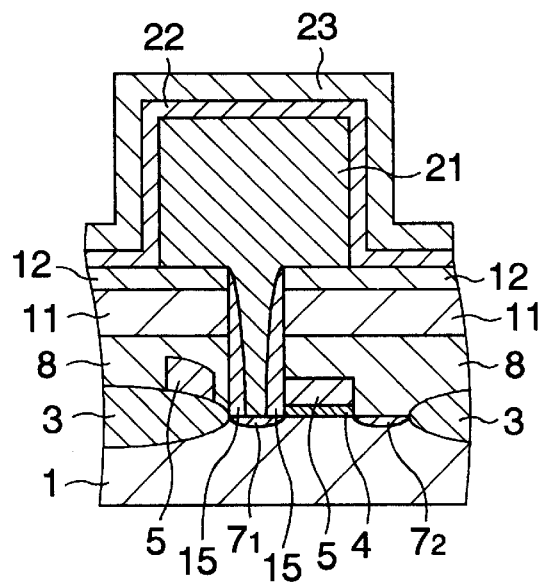
Figure 3D:
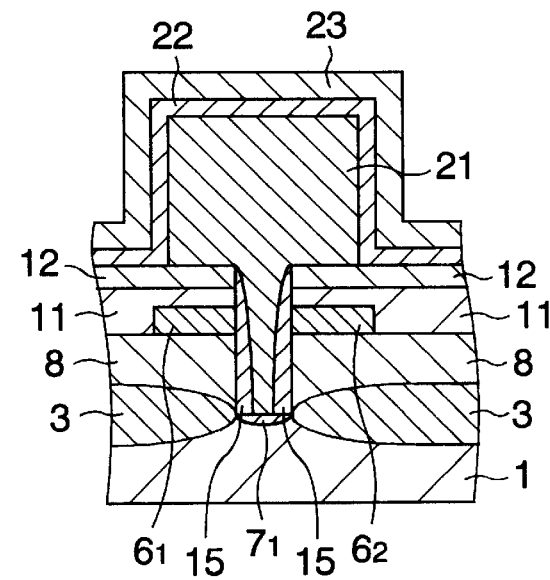

A DRAM of COB structure which is a semiconductor storage device according to a first embodiment of the present invention, as shown in FIGS. 3C, 3D, comprises: a silicon semiconductor substrate 1 having a device activation region 2 (cf. FIGS. 1A and 1B) defined by a device isolation structure; an access transistor formed at the device activation region 2 in the semiconductor substrate 1, and having a gate electrode 5 and first and second impurity diffusion layers $7_1$ and $7_2$; a silicon oxide film 11 (a first insulating film) formed above the access transistor, and having a first contact hole for exposing a portion of the surface of the first impurity diffusion layer $7_1$; a silicon nitride film 12 (a protective film) formed on the silicon oxide film 11, and having a second contact hole formed on the first contact hole; a side wall 15 (a second insulating film) formed on the side wall faces of the first and second contact holes; and a memory capacitor in which a storage node electrode 21 (a lower electrode) and a cell plate electrode 23 (an upper electrode) are opposed to each other and capacitive-coupled through a dielectric film 22. Here, the storage node electrode 21 of the memory capacitor is filled inside the first and second contact holes to be formed in an island-like shape on the silicon oxide film 11 through the silicon nitride film 12 so as to be electrically connected with the first impurity diffusion layer $7_1$. Each of the first and second contact holes has the diameter which is made smaller by the existence of the side wall 15 than a minimum dimension determined by an exposure limit in the photolithography.

Figure 16:
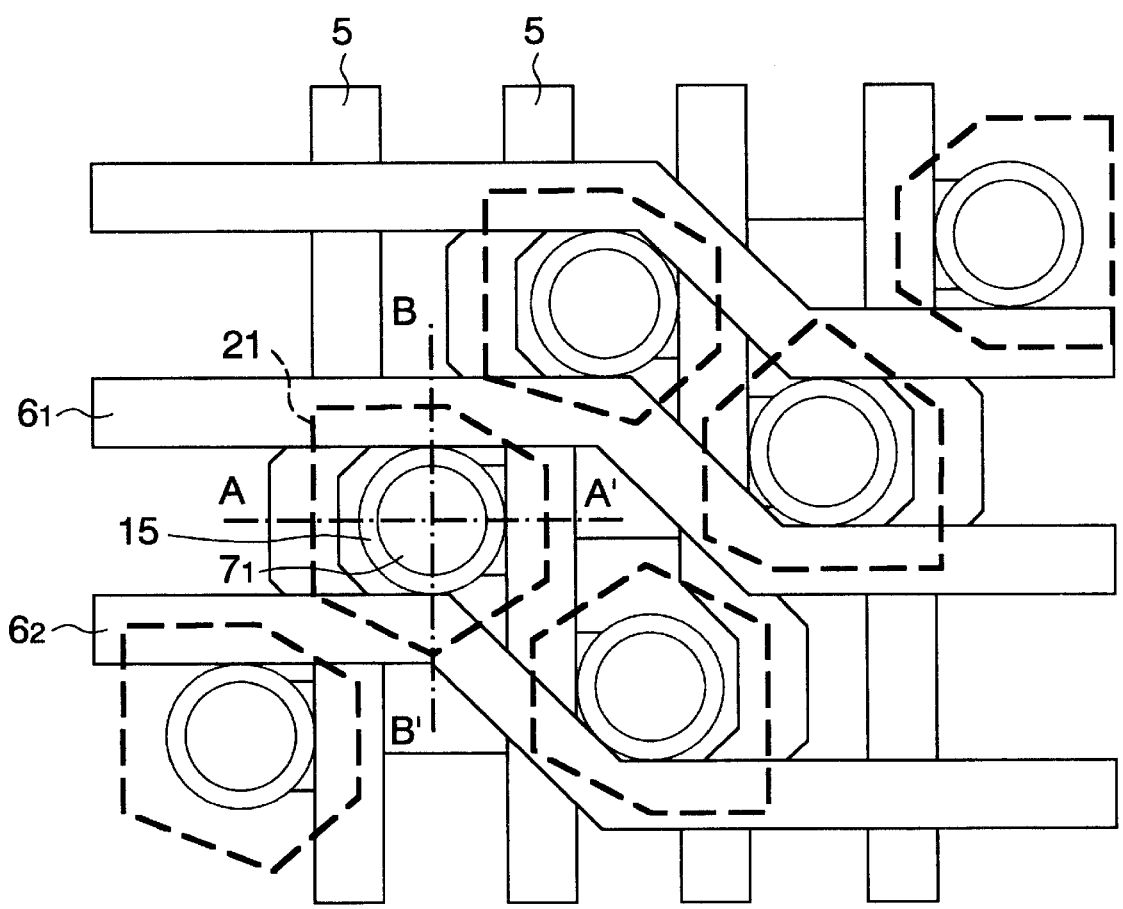
FIG. 16 is a plane view of the DRAM of COB structure which is the semiconductor storage device according to the first embodiment of the present invention.

Next, the description will be given below concerning a method of fabricating this DRAM, referring to FIGS. 1A–1F, 2A–2F and 3A–3D. Incidentally, FIGS. 1A, 1C, 1E, 2A, 2C, 2E, 3A and 3C are cross sectional views along a direction (A–A' line in FIG. 16) perpendicular to the gate electrode (a word line), and FIGS. 1B, 1D, 1F, 2B, 2D, 2F, 3B and 3D are cross sectional views along a direction (B–B' line in FIG. 16) perpendicular to a bit line.

Figure 1A:
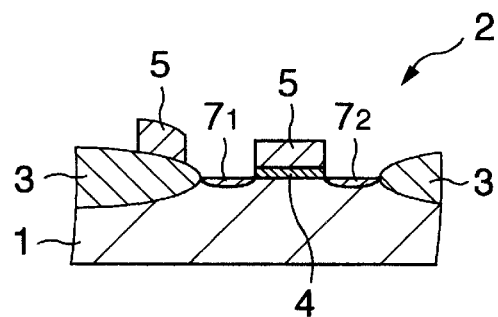
FIGS. 1A–1F are cross sectional views showing, in processing order, a method of fabricating a DRAM of COB structure which is a semiconductor storage device according to a first embodiment of the present invention.
Figure 1B:
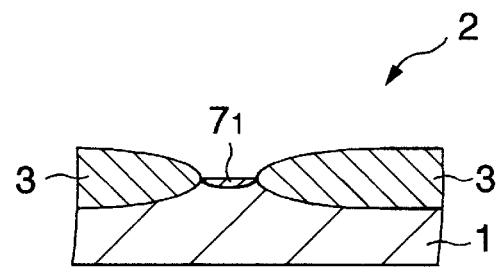

The access transistor, as shown in FIG. 1A, is formed at the device activation region 2 in the p-type silicon semiconductor substrate 1, for example. Concretely, as shown in FIGS. 1A and 1B, a field oxide film 3 is formed by so-called a LOCOS method at a device isolation region on the semiconductor substrate 1. This makes the device activation region 2 defined. After that, a silicon oxide film is formed by performing a thermal oxidizing treatment for the surface of the semiconductor substrate 1 at the device activation region 2. Then, a polycrystal silicon film doped with an n-type impurity (for example, phosphorus) is formed by the CVD method on the silicon oxide film. After that, the silicon oxide film and the polycrystal silicon film are patterned using the photolithography and the subsequent dry etching so as to leave the silicon oxide film and the polycrystal silicon film in an electrode-like shape at the device activation region 2, thereby forming a gate oxide film 4 and the gate electrode 5 (a word line). After that, the first and second impurity diffusion layers $7_1$ and $7_2$, which are to become a source/drain, are formed by performing, with the gate electrode 5 as a mask, ion implantation of an n-type impurity (for example, phosphorus) into the surface region of the semiconductor substrate 1 on the both sides of the gate electrode 5. Thereby, the access transistor having the gate electrode 5 and the pair of impurity diffusion layers $7_1$ and $7_2$ is formed.

Figure 1C:
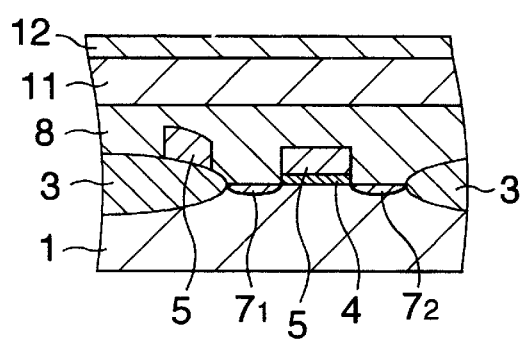
Figure 1D:
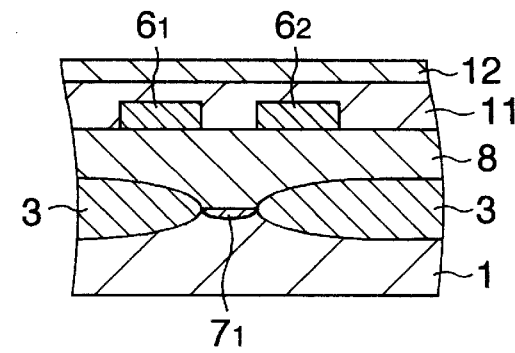

Subsequently, as shown in FIGS. 1C and 1D, a silicon oxide film is deposited by the CVD method over the semiconductor substrate 1 including the field oxide film 3, thereby forming an interlayer insulating film 8. Two bit lines (first and second bit lines $6_1$ and $6_2$) are patterned on the interlayer insulating film 8 so that they intersect the gate electrode 5 at about right angles (cf. FIG. 16). Incidentally, the first bit line $6_1$ is connected with the second impurity diffusion layer $7_2$ (a drain). The silicon oxide film 11 about 100 nm thick is deposited on the interlayer insulating film 8 so that the first and second bit lines $6_1$ and $6_2$ are buried. Then, the silicon nitride film 12 about 10 nm to 50 nm thick is deposited on the silicon oxide film 11.

Figure 1E:
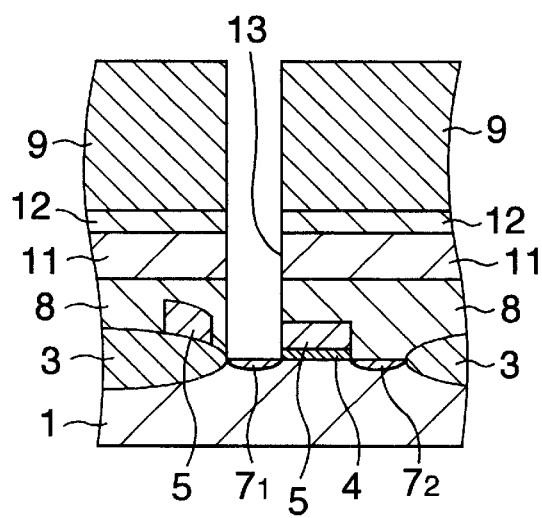
Figure 1F:
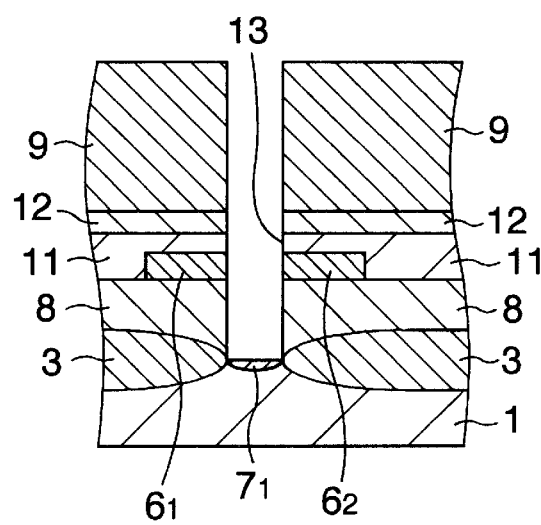

Subsequently, as shown in FIGS. 1E and 1F, after a resist mask 9 is formed on the silicon nitride film 12 by the photolithography, a dry etching of the silicon nitride film 12, the silicon oxide film 11 and the interlayer insulating film 8 is performed. As a result, a storage contact hole 13 for exposing a portion of the surface of the first impurity diffusion layer $7_1$ (a source) is formed. The dry etching is carried out under the following conditions: using a parallel flat board type RIE apparatus; gas flow quantity of $CHF_3$=20 ccm; gas flow quantity of $CF_4$=10 ccm; gas flow quantity of Ar=200 ccm; fed RF power=800 W; pressure=27 Pa; and the selection ratio of the silicon nitride film to the silicon oxide film=2. The storage contact hole 13 is about 500 nm to 1200 nm deep and about 200 nm to 400 nm (a minimum dimension based on the design rule) in diameter. In some cases, on the side wall face of the storage contact hole 13, there is exposed the side face of the gate electrode 5 as shown in FIG. 1E, or there are exposed the side faces of the first and second bit lines $6_1$ and $6_2$ as shown in FIG. 1F.

Figure 2A:
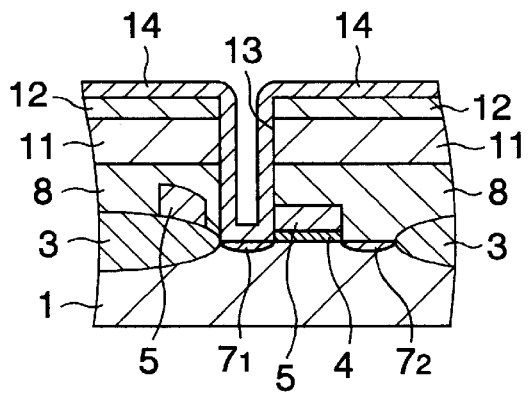
FIGS. 2A–2F are cross sectional views showing, in processing order, the method of fabricating the DRAM of COB structure which is the semiconductor storage device according to the first embodiment of the present invention.
Figure 2B:
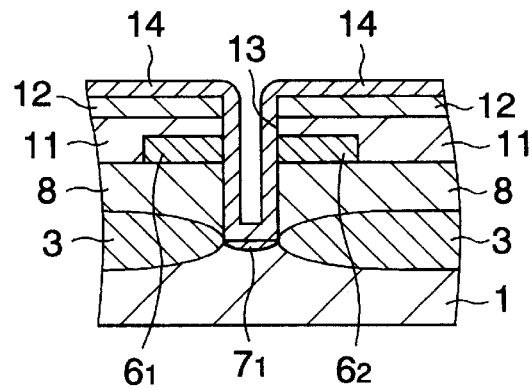
Figure 2C:
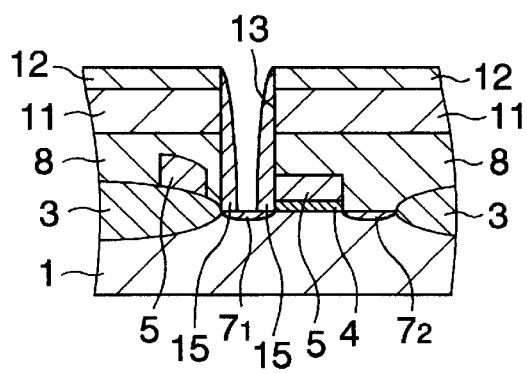
Figure 2D:
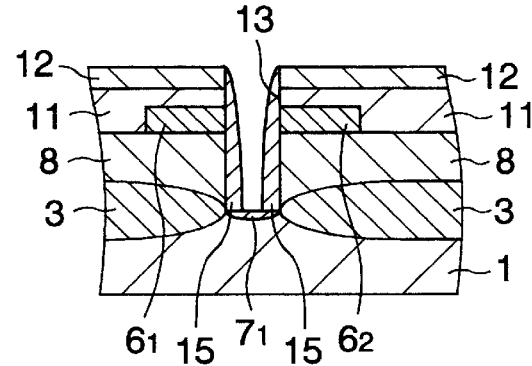

Subsequently, after the resist mask 9 is eliminated by an ashing, a silicon oxide film 14 about 100 nm to 200 nm thick, as shown in FIGS. 2A and 2B, is conformally deposited over the silicon nitride film 12 including the inner surface of the storage contact hole 13. An anisotropic etching of the silicon oxide film 14 is performed with the silicon nitride film 12 as a stopper. As a result, the silicon oxide film 14 is left only on the side wall face of the storage contact hole 13, so that the side wall 15 the film thickness of which is about 70 nm to 180 nm is formed as shown in FIGS. 2C and 2D. Consequently, even if the side face of the gate electrode 5 or the side faces of the first and second bit lines $6_1$ and $6_2$ are exposed at the time of forming the storage contact hole 13 (cf. FIGS. 1E and 1F), the exposed areas are completely covered by the side wall 15. This makes it possible to prevent a short-circuit between the gate electrode 5 and a storage node electrode 21 (described later) accompanied by the microminiaturization of memory cells in the DRAM, or a short-circuit between the first and second bit lines $6_1$ and $6_2$ and the storage node electrode 21. Additionally, the anisotropic etching of the silicon oxide film 14 is performed under the following conditions: using the parallel flat board type RIE apparatus; gas flow quantity of $CHF_3$=20 ccm; gas flow quantity of $CF_4$=10 ccm; gas flow quantity of Ar=200 ccm; gas flow quantity of CO=800 ccm; gas flow quantity of $C_4F_8$=20 ccm; fed RF power=800 W;

pressure=27 Pa; and selection ratio of the silicon nitride film to the silicon oxide film=10.

Figure 2E:
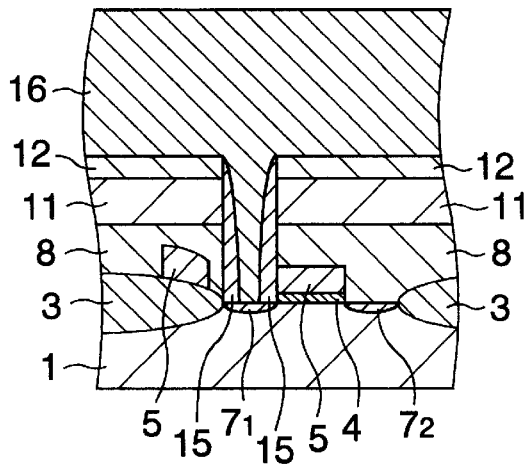
Figure 2F:
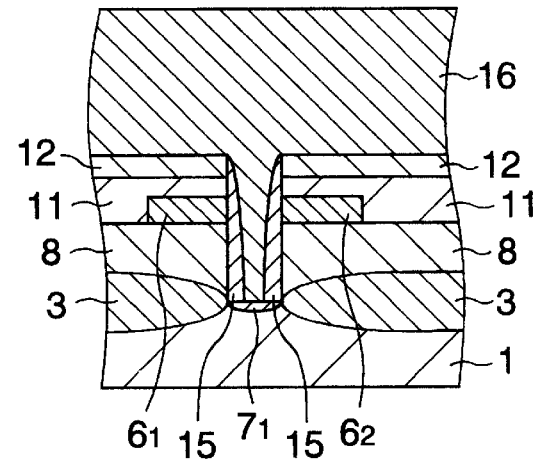

Subsequently, as shown in FIGS. 2E and 2F, a polycrystal silicon film 16, which is doped with an n-type impurity (for example, phosphorus) and about 100 nm thick, is deposited by the CVD method on the silicon nitride film 12 so that the storage contact hole 13 is filled. A photolithography for the polycrystal silicon film 16 and a subsequent dry etching thereof are performed with the silicon nitride film 12 as a stopper, thereby, as shown in FIGS. 3A and 3B, accomplishing patterning of the polycrystal silicon film 16 into a predetermined electrode-like shape. As a result, the island-like shaped storage node electrode 21 that is connected through the storage contact hole 13 with the first impurity diffusion layer $7_1$ functioning as a source is formed on the silicon nitride film 12.

Subsequently, after a resist mask employed for the patterning is eliminated by an ashing, a silicon oxide film, a silicon nitride film and a silicon oxide film are formed one by one in such a manner as to cover the storage node electrode 21, thereby forming, as shown in FIGS. 3C and 3D, a dielectric film 22 comprising an ONO film in such a manner as to cover the surface of the storage node electrode 21. A polycrystal silicon film is formed on the dielectric film 22, thereby forming the cell plate electrode 23 opposed to the storage node electrode 21 through the dielectric film 22. This forms the memory capacitor that comprises the storage node electrode 21, the dielectric film 22 and the cell plate electrode 23.

Subsequently, the DRAM is formed through a step of forming interlayer insulating films, a step of forming vias, a step of forming interconnections and a step of forming a peripheral circuit unit in the memory cell unit, although the accompanying drawings are omitted.

As described above, in the present embodiment, the side wall 15 is formed in such a manner as to cover the side wall face of the storage contact hole 13 having the diameter of minimum dimension. This makes it possible to make the substantial diameter of the storage contact hole 13 smaller than a minimum dimension determined by the exposure limit. Also, when forming the side wall 15, the silicon nitride film 12, which is to become a protective film, is formed on the silicon oxide film 11, and the anisotropic etching of the silicon oxide film 14 is performed with the silicon nitride film 12 as a stopper. This makes it possible to prevent the silicon oxide film 11 from being influenced by this anisotropic etching. Also, concerning the etching of the silicon oxide film 14 for which a high selectivity between the silicon nitride film and the silicon oxide film is required, the etching quantity needed is determined not by depth of the storage contact hole 13 but by the thickness of the silicon oxide film 14. This allows the etching to be performed under an etching condition that the selection ratio is equal to about 5. As a result, it becomes possible to ensure sufficient insulation between the storage node electrode 21 and the gate electrode 5, and sufficient insulation between the storage node electrode 21 and the first and second bit lines $6_1$ and $6_2$.

Accordingly, the present embodiment allows enough alignment leeway to be ensured in the photolithography, thus making it possible to embody formation of the storage node electrode 21 which establishes no short-circuit with the gate electrode 5 (a word line) or the first and second bit lines $6_1$ and $6_2$. This further makes it possible to respond to the microminiaturization and the high integration of semiconductor devices as well as to embody a high reliability of the memory capacitor.

(Second Embodiment)

Figure 6A:
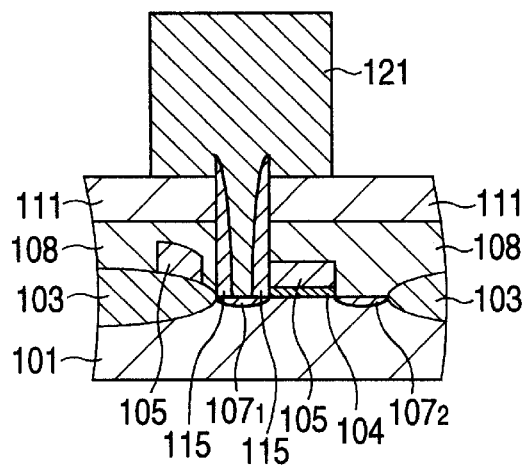
FIGS. 6A–6D are cross sectional views showing, in processing order, the method of fabricating the DRAM of COB structure which is the semiconductor storage device according to the second embodiment of the present invention.
Figure 6B:
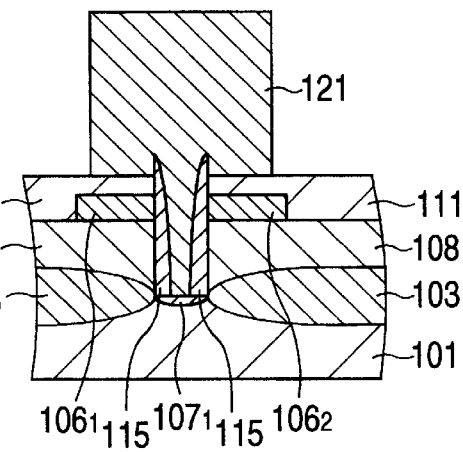
Figure 6C:
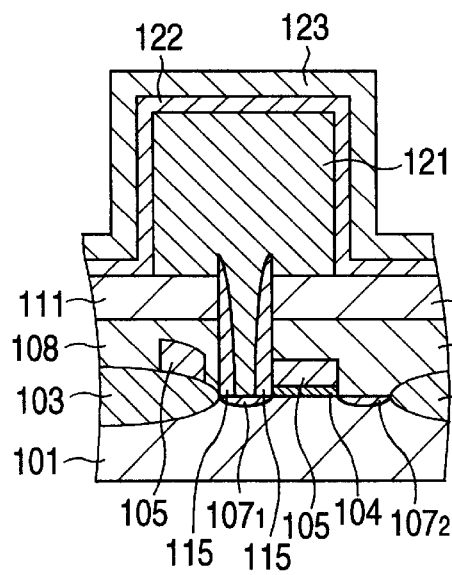
Figure 6D:
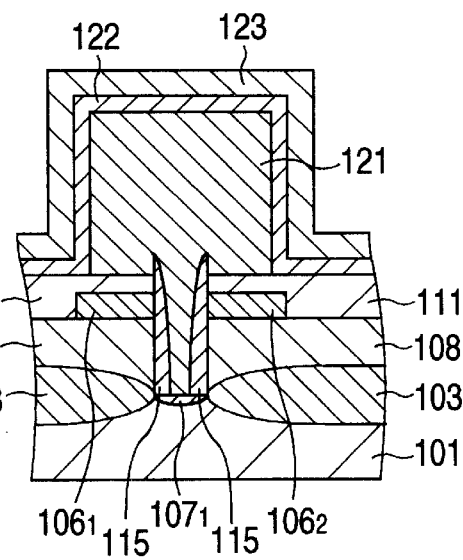

A semiconductor storage device according to a second embodiment of the present invention differs from the above-described DRAM according to the first embodiment in that a protective film is also used as a storage node electrode in the memory capacitor by employing a polycrystal silicon film as the protective film. As a result, in a DRAM according to the present embodiment, a side wall 115 (a second insulating film), as shown in FIGS. 6C and 6D, is formed on a side wall face of a contact hole in a silicon oxide film 111 (a first insulating film) in such a manner as to protrude from the contact hole toward a storage node electrode 121.

Next, the description will be given below concerning a method of fabricating this DRAM, referring to FIGS. 4A–4F, 5A–5D and 6A–6D. Incidentally, FIGS. 4A, 4C, 4E, 5A, 5C, 6A and 6C are cross sectional views along a direction perpendicular to the gate electrode (a word line), and FIGS. 4B, 4D, 4F, 5B, 5D, 6B and 6D are cross sectional views along a direction perpendicular to a bit line.

Figure 4A:
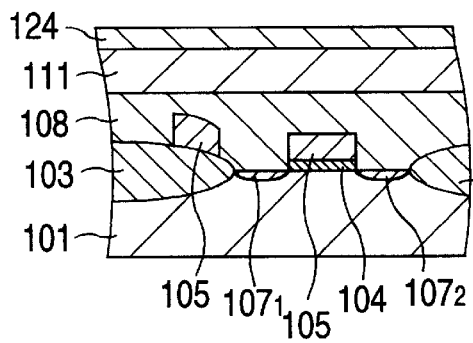
FIGS. 4A–4F are cross sectional views showing, in processing order, a method of fabricating the DRAM of COB structure which is a semiconductor storage device according to a second embodiment of the present invention.
Figure 4B:
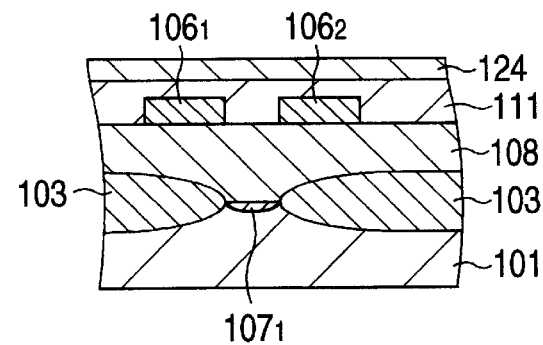

As is the case with the steps shown in FIGS. 1A–1D in the method of fabricating the DRAM according to the first embodiment, formed are a field oxide film 103, an access transistor having a gate electrode 105 (a word line) on a gate oxide film 104 and first and second impurity diffusion layers $107_1$ and $107_2$, an interlayer insulating film 108, two bit lines (first and second bit lines $106_1$ and $106_2$) and a silicon oxide film 111 (a first insulating film) (cf. FIGS. 4A and 4B). After that, a polycrystal silicon film 124, which is doped with an n-type impurity (for example, phosphorus) and about 50 nm to 200 nm thick, is deposited by the CVD method on the silicon oxide film 111.

Figure 4C:
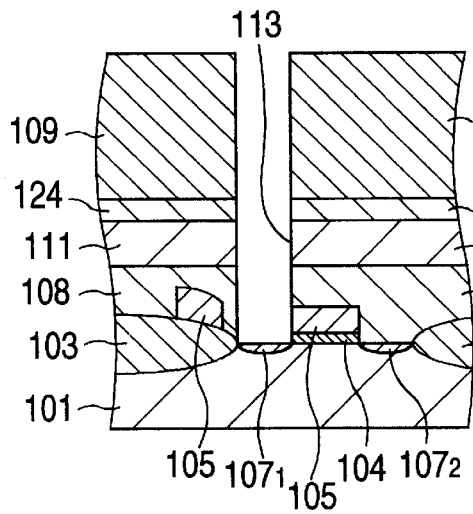
Figure 4D:
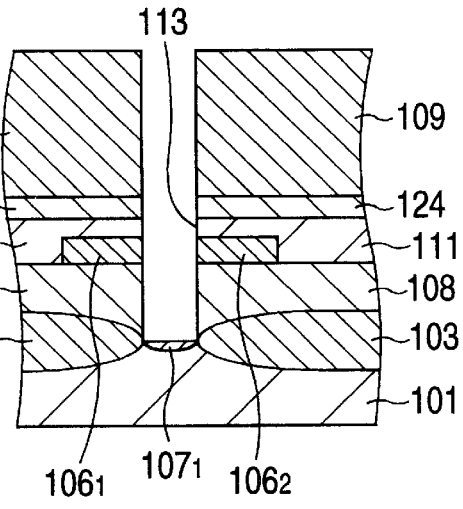

Subsequently, as shown in FIGS. 4C, and 4D, after a resist mask 109 is formed on the polycrystal silicon film 124 by the photolithography, a dry etching of the polycrystal silicon film 124, the silicon oxide film 111 and the interlayer insulating film 108 is performed so as to form a storage contact hole 113 for exposing a portion of the surface of the first impurity diffusion layer $107_1$ (a source). The storage contact hole 113 is about 500 nm to 1200 nm deep and about 200 nm to 400 nm (a minimum dimension based on the design rule) in diameter. In some cases, on the side wall face of the storage contact hole 113, there is exposed the side face of the gate electrode 105 as shown in FIG. 4C, or there are exposed the side faces of the first and second bit lines $106_1$ and $106_2$ as shown in FIG. 4D.

Figure 4E:
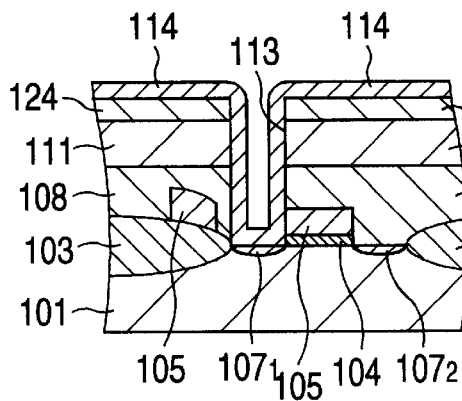
Figure 4F:
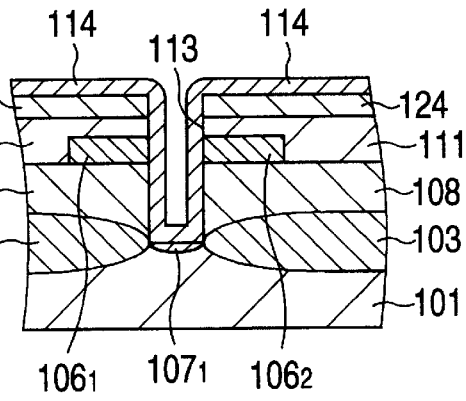
Figure 5A:
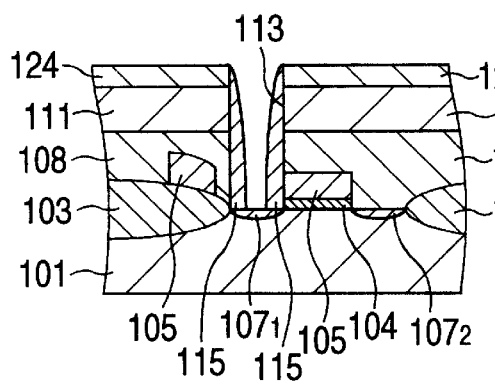
FIGS. 5A–5D are cross sectional views showing, in processing order, the method of fabricating the DRAM of COB structure which is the semiconductor storage device according to the second embodiment of the present invention.
Figure 5B:
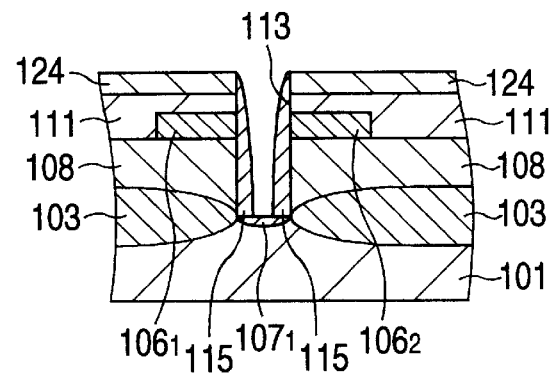

Subsequently, after the resist mask 109 is eliminated by an ashing, a silicon oxide film 114 about 100 nm to 200 nm thick, as shown in FIGS. 4E and 4F, is conformally deposited over the polycrystal silicon film 124 including the inner surface of the storage contact hole 113. An anisotropic etching of the silicon oxide film 114 is performed with the polycrystal silicon film 124 as a stopper. As a result, the silicon oxide film 114 is left only on the side wall face of the storage contact hole 113, so that the side wall 115 the thickness of which is about 70 nm to 180 nm is formed as shown in FIGS. 5A and 5B. In the anisotropic etching, under the same conditions as those in the first embodiment, the etching of the silicon oxide film can be performed with a high selection ratio of about 100 with reference to the polycrystal silicon film. As a result, even if the side face of the gate electrode 105 or the side faces of the first and second bit lines $106_1$ and $106_2$ are exposed at the time of forming the storage contact hole 113 (cf. FIGS. 4C and 4D), the exposed areas are completely covered by the side wall 115. This makes it possible to prevent a short-circuit between the gate electrode 105 and a storage node electrode 121 (described later) accompanied by the microminiaturization of memory cells in the DRAM, or a short-circuit between the first and second bit lines $106_1$ and $106_2$ and the storage node electrode 121.

Figure 5C:
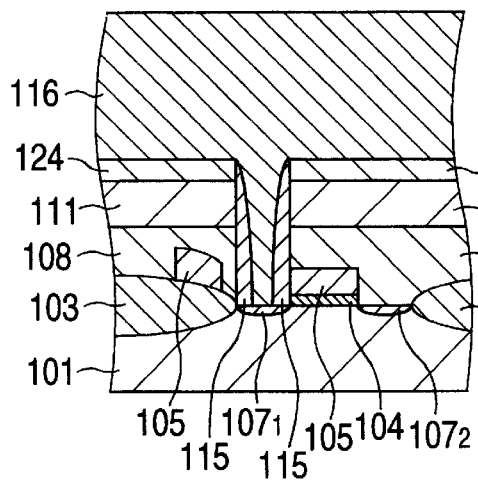
Figure 5D:
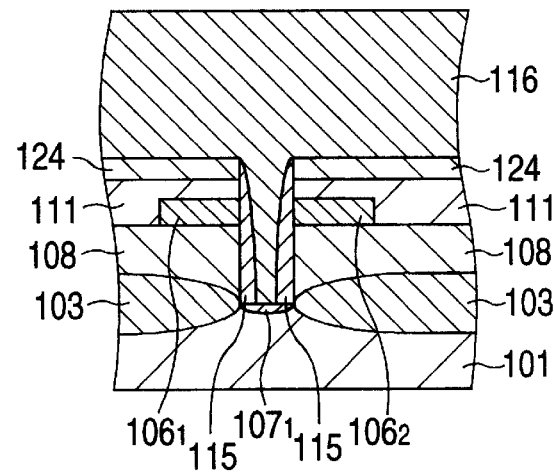

Subsequently, as shown in FIGS. 5C and 5D, a polycrystal silicon film 116, which is doped with an n-type impurity (for example, phosphorus) and about 100 nm thick, is deposited by the CVD method on the polycrystal silicon film 124 so that the storage contact hole 113 is filled. A photolithography for the polycrystal silicon film 116 and the polycrystal silicon film 124 and a subsequent dry etching thereof are performed with the silicon oxide film 111 as a stopper, thereby, as shown in FIGS. 6A and 6B, accomplishing patterning of the polycrystal silicon film 116 and the polycrystal silicon film 124 into a predetermined electrode-like shape. As a result, the island-like shaped storage node electrode 121 that is connected through the storage contact hole 113 with the first impurity diffusion layer $107_1$ functioning as a source is formed on the silicon oxide film 111. Namely, the island-like shaped storage node electrode 121, into which the polycrystal silicon film 116 and the polycrystal silicon film 124 are integrated, is formed on the silicon oxide film 111.

Subsequently, after a resist mask employed for the patterning is eliminated by an ashing, a silicon oxide film, a silicon nitride film and a silicon oxide film are formed one by one in such a manner as to cover the storage node electrode 121, thereby forming, as shown in FIGS. 6C and 6D, a dielectric film 122 comprising an ONO film in such a manner as to cover the surface of the storage node electrode 121. After that, a polycrystal silicon film is formed on the dielectric film 122, thereby forming a cell plate electrode 123 opposed to the storage node electrode 121 through the dielectric film 122. This forms the memory capacitor that comprises the storage node electrode 121, the dielectric film 122, and the cell plate electrode 123.

Subsequently, the DRAM is formed through a step of forming interlayer insulating films, a step of forming vias, a step of forming interconnections and a step of forming a peripheral circuit unit in the memory cell unit, although the accompanying drawings are omitted. Incidentally, the peripheral circuit unit in the memory cell unit is generally formed together with the memory cell unit.

As described above, in the present embodiment, the side wall 115 is formed in such a manner as to cover the side wall face of the storage contact hole 113 having the diameter of minimum dimension. This makes it possible to make the substantial diameter of the storage contact hole 113 smaller than a minimum dimension determined by the exposure limit. Also, when forming the side wall 115, the polycrystal silicon film 124, which is to become a protective film, is formed on the silicon oxide film 111, and the anisotropic etching of the silicon oxide film 114 is performed with the polycrystal silicon film 124 as a stopper. This makes it possible to prevent the silicon oxide film 111 from being influenced by this anisotropic etching. As a result, it becomes possible to ensure sufficient insulation between the storage node electrode 121 and the gate electrode 105, and sufficient insulation between the storage node electrode 121 and the first and second bit lines $106_1$ and $106_2$.

Accordingly, the present embodiment allows enough alignment leeway to be ensured in the photolithography, thus making it possible to embody formation of the storage node electrode 121 which establishes no short-circuit with the gate electrode 105 (a word line) or the first and second bit lines $106_1$ and $106_2$. This further makes it possible to respond to the microminiaturization and the high integration of semiconductor devices as well as to embody a high reliability of the memory capacitor.

(Third Embodiment)

A semiconductor storage device according to a third embodiment of the present invention differs from the above-described DRAM according to the first embodiment which is the DRAM of COB structure in that it is a DRAM of CUB (Capacitor Under Bitline) structure in which bit lines (first and second bit lines $206_1$ and $206_2$) are formed over a memory capacitor (cf. the above-mentioned JP-A-4-130722).

Next, the description will be given below concerning a method of fabricating this DRAM, referring to FIGS. 7A–7H, 8A–8F and 9A–9D. Incidentally, FIGS. 7A, 7C, 7E, 7G, 8A, 8C, 8E, 9A and 9C are cross sectional views along a direction perpendicular to a gate electrode (a word line), and FIGS. 7B, 7D, 7F, 7H, 8B, 8D, 8F, 9B and 9D are cross sectional views along a direction perpendicular to a bit line.

Figure 7A:
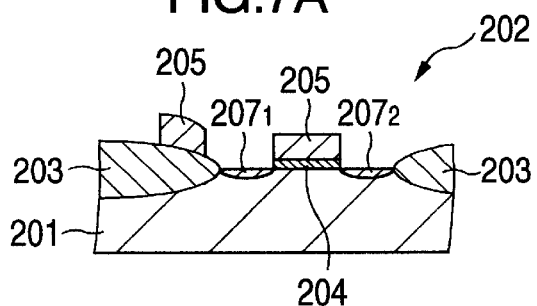
FIGS. 7A–7H are cross sectional views showing, in processing order, a method of fabricating a DRAM of CUB structure which is a semiconductor storage device according to a third embodiment of the present invention.
Figure 7B:
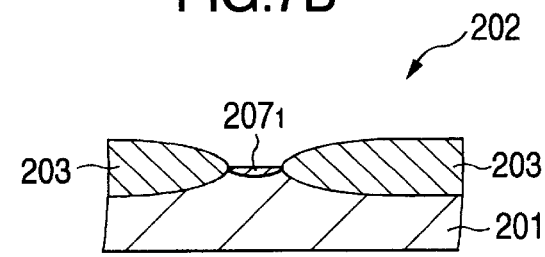

An access transistor, as shown in FIG. 7A, is formed at a device activation region 202 in a p-type silicon semiconductor substrate 201, for example. Concretely, as shown in FIGS. 7A and 7B, a field oxide film 203 is formed by so-called a LOCOS method at a device isolation region on the semiconductor substrate 201. This makes the device activation region 202 defined. A silicon oxide film is formed by performing a thermal oxidizing treatment for the surface of the semiconductor substrate 201 at the device activation region 202. Then, a polycrystal silicon film doped with an n-type impurity (for example, phosphorus) is formed by the CVD method. The silicon oxide film and the polycrystal silicon film are patterned using the photolithography and the subsequent dry etching so as to leave the silicon oxide film and the polycrystal silicon film in an electrode-like shape at the device activation region 202, thereby forming a gate oxide film 204 and a gate electrode 205 (a word line). First and second impurity diffusion layers $207_1$ and $207_2$, which are to become source and drain, are formed by performing, with the gate electrode 205 as a mask, ion implantation of an n-type impurity (for example, phosphorus) into a surface region of the semiconductor substrate 201 on the both sides of the gate electrode 205. Thereby, the access transistor having the gate electrode 205 and the pair of impurity diffusion layers $207_1$ and $207_2$ is formed.

Figure 7C:
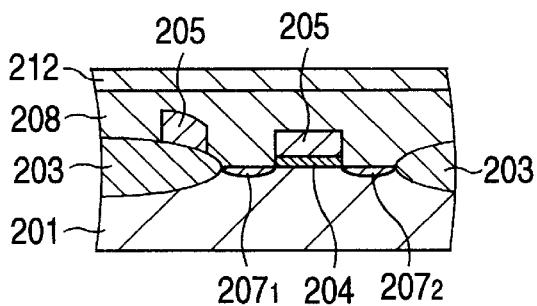
Figure 7D:
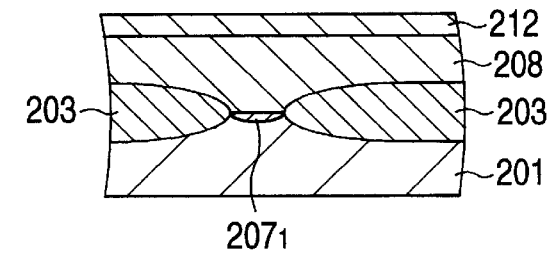

Subsequently, as shown in FIGS. 7C and 7D, a silicon oxide film is deposited by the CVD method over the semiconductor substrate 201 including the field oxide film 203, thereby forming an interlayer insulating film 208 (a first insulating film). A silicon nitride film 212 (a protective film) about 10 nm to 50 nm thick is deposited on the interlayer insulating film 208.

Figure 7E:
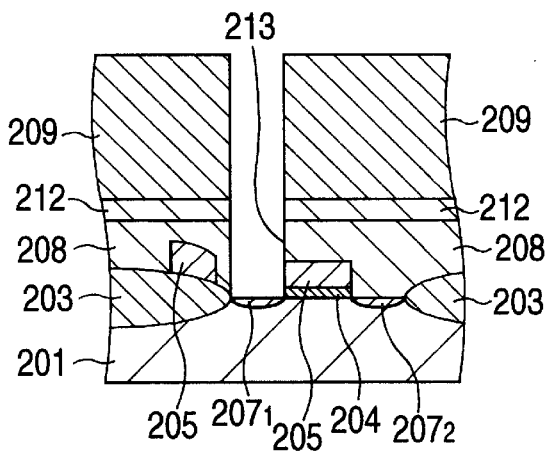
Figure 7F:
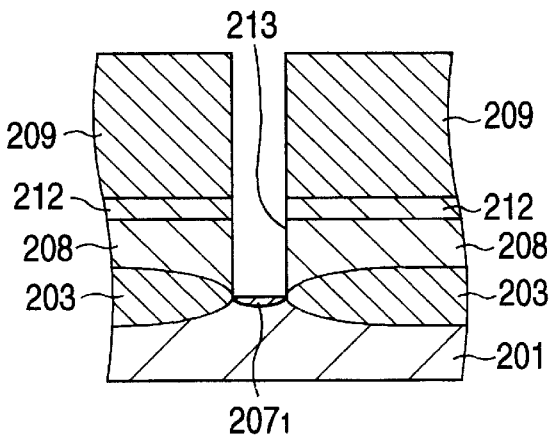

Subsequently, as shown in FIGS. 7E and 7F, after a resist mask 209 is formed on the silicon nitride film 212 by the photolithography, a dry etching of the silicon nitride film 212 and the interlayer insulating film 208 is performed so as to form a storage contact hole 213 for exposing a portion of the surface of the first impurity diffusion layer $207_1$ (a source). The dry etching is carried out under the following conditions: using the parallel flat board type RIE apparatus; gas flow quantity of $CHF_3$=20 ccm; gas flow quantity of $CF_4$=10 ccm; gas flow quantity of Ar=200 ccm; fed RF power=800 W; pressure=27 Pa; and the selection ratio of the silicon nitride film to the silicon oxide film=2. The storage contact hole 213 is about 500 nm to 1200 nm deep and about 200 nm to 400 nm (a minimum dimension based on the design rule) in diameter. In some cases, on the side wall face of the storage contact hole 213, there is exposed the side face of the gate electrode 205 as shown in FIG. 7E.

Figure 7G:
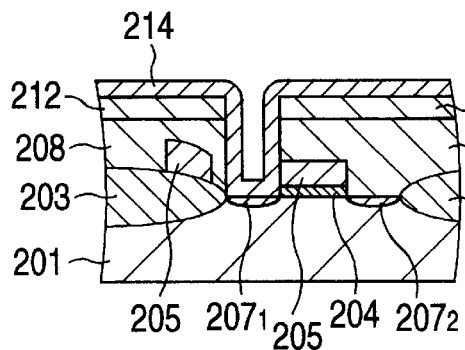
Figure 7H:
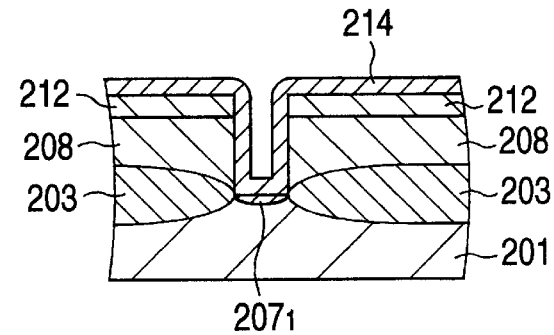
Figure 8A:
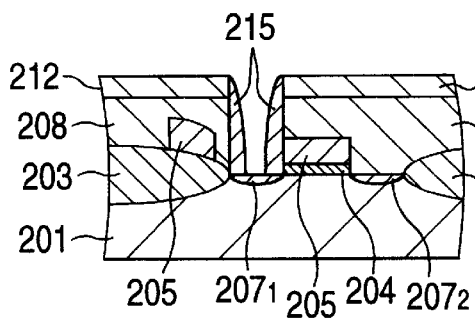
FIGS. 8A–8F are cross sectional views showing, in processing order, the method of fabricating the DRAM of CUB structure which is the semiconductor storage device according to the third embodiment of the present invention.
Figure 8B:
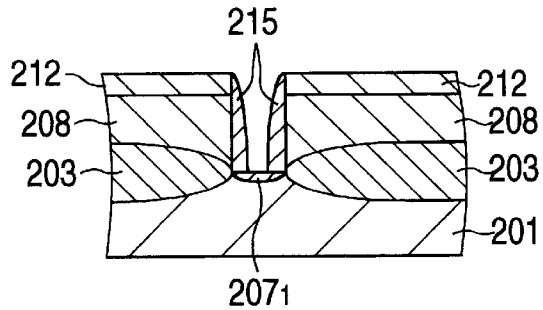

Subsequently, after the resist mask 209 is eliminated by an ashing, a silicon oxide film 214 about 100 nm to 200 nm thick, as shown in FIGS. 7G and 7H, is conformally deposited over the silicon nitride film 212 including the inner surface of the storage contact hole 213. An anisotropic etching of the silicon oxide film 214 is performed with the silicon nitride film 212 as a stopper so as to leave the silicon oxide film 214 only on the side wall face of the storage contact hole 213, thereby forming, as shown in FIGS. 8A and 8B, a side wall 215 (a second insulating film) the thickness of which is about 70 nm to 180 nm. As a result, even if the side face of the gate electrode 205 is exposed at the time of forming the storage contact hole 213 (cf. FIGS. 7E), the exposed area is completely covered by the side wall 215. This makes it possible prevent a short-circuit between the gate electrode 205 and a storage node electrode 221 (described later) accompanied by the microminiaturization of memory cells in the DRAM. Additionally, the anisotropic etching of the silicon oxide film 214 is performed under the following conditions: using the parallel flat board type RIE apparatus; gas flow quantity of $CHF_3$=20 ccm; gas flow quantity of $CF_4$=10 ccm; gas flow quantity of Ar=200 ccm; gas flow quantity of CO=800 ccm; gas flow quantity of $C_4F_8$=20 ccm; fed RF power=800 W; pressure=27 Pa; and the selection ratio of the silicon nitride film to the silicon oxide film=10.

Figure 8C:
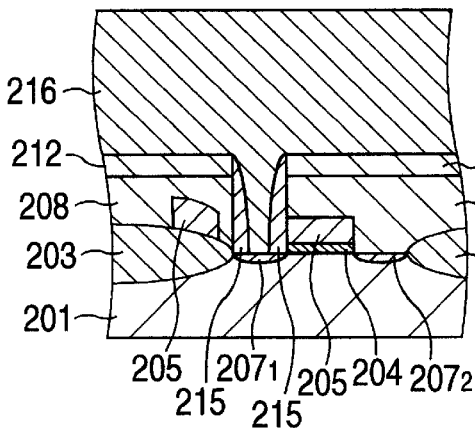
Figure 8D:
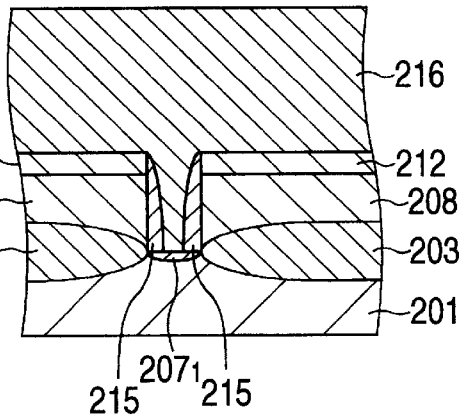
Figure 8E:
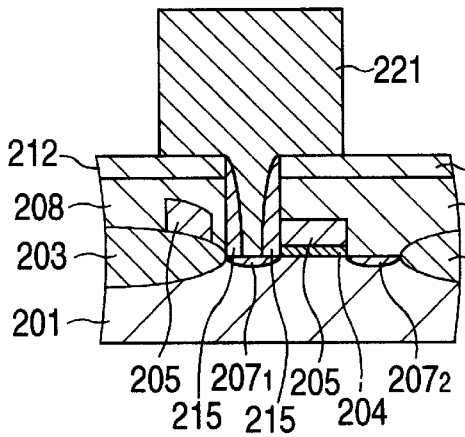
Figure 8F:
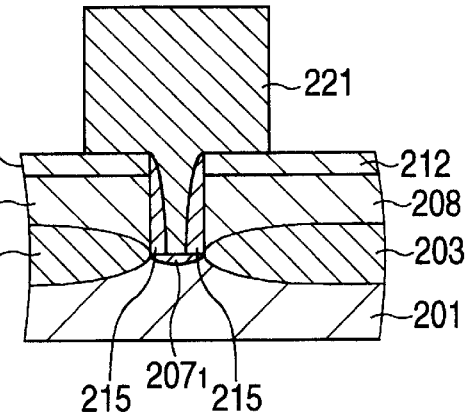

Subsequently, as shown in FIGS. 8C and 8D, a polycrystal silicon film 216, which is doped with an ntype impurity (for example, phosphorus) and about 100 nm thick, is deposited by the CVD method on the silicon nitride film 212 so that the storage contact hole 213 is filled. A photolithography for the polycrystal silicon film 216 and a subsequent dry etching thereof are performed with the silicon nitride film 212 as a stopper, thereby, as shown in FIGS. 8D and 8E, accomplishing patterning of the polycrystal silicon film 216 into a predetermined electrode-like shape. This forms, on the silicon nitride film 212, the island-like shaped storage node electrode 221 connected through the storage contact hole 213 with the first impurity diffusion layer $207_1$ functioning as a source.

Figure 9A:
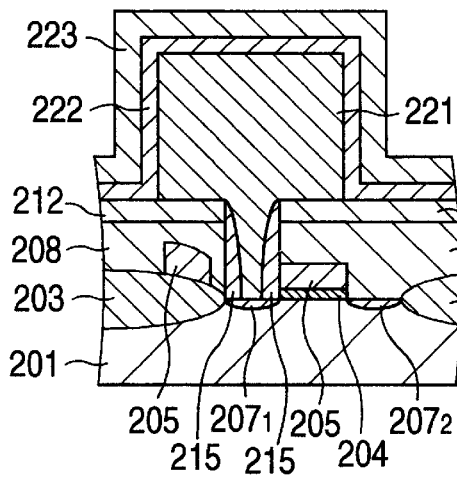
FIGS. 9A–9D are cross sectional views showing, in processing order, the method of fabricating the DRAM of CUB structure which is the semiconductor storage device according to the third embodiment of the present invention.
Figure 9B:
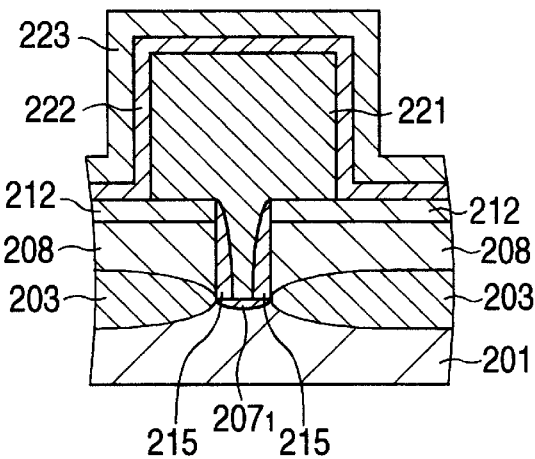

Subsequently, after a resist mask employed for the patterning is eliminated by an ashing, a silicon oxide film, a silicon nitride film and a silicon oxide film are formed one by one in such a manner as to cover the storage node electrode 221, thereby forming, as shown in FIGS. 9A and 9B, a dielectric film 222 comprising an ONO film in such a manner as to cover the surface of the storage node electrode 221. A polycrystal silicon film is formed on the dielectric film 222, thereby forming a cell plate electrode 223 opposed to the storage node electrode 221 through the dielectric film 222. This forms the memory capacitor that comprises the storage node electrode 221, the dielectric film 222 and the cell plate electrode 223.

Figure 9C:
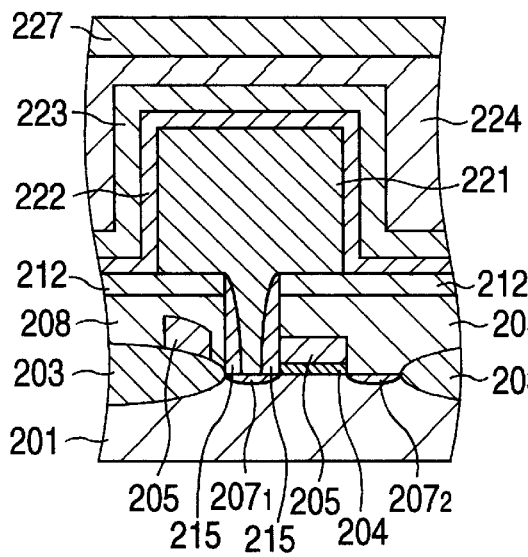
Figure 9D:
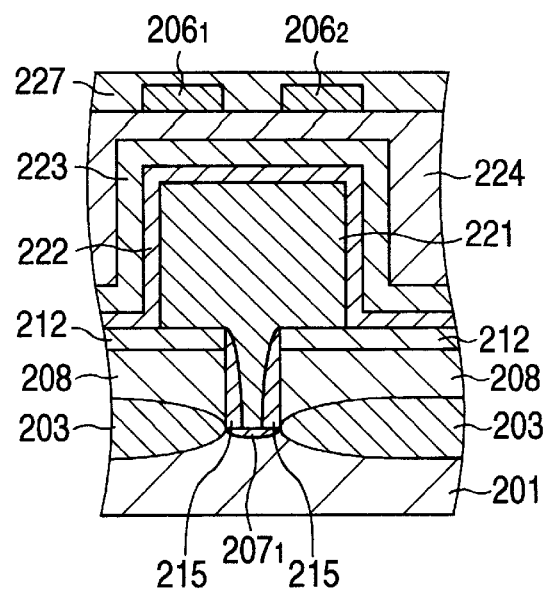

Subsequently, as shown in FIGS. 9C and 9D, after an interlayer insulating film 224 is formed over the semiconductor substrate 201, pattern formation of two bit lines (first and second bit lines $206_1$ and $206_2$) is carried out on the interlayer insulating film 224 so that they intersect the gate electrode 205 at about right angles. Incidentally, the first bit line $206_1$ is connected with the second impurity diffusion layer $207_2$ (a drain). A silicon oxide film 227 about 100 nm thick is deposited on the interlayer insulating film 224 so that the first and second bit lines $206_1$ and $206_2$ are buried.

Subsequently, the DRAM of CUB structure is formed through a step of forming interlayer insulating films, a step of forming vias, a step of forming interconnections and a step of forming a peripheral circuit unit in the memory cell unit, although the accompanying drawings are omitted.

As described above, in the present embodiment, the side wall 215 is formed in such a manner as to cover the side wall face of the storage contact hole 213 having the diameter of minimum dimension. This makes it possible to make the substantial diameter of the storage contact hole 213 smaller than a minimum dimension determined by the exposure limit. Also, the formation of the side wall 215 enables sufficient insulation to be ensured between the storage node electrode 221 and the gate electrode 205.

Accordingly, the present embodiment allows enough alignment leeway to be ensured in the photolithography, thus making it possible to embody formation of the storage node electrode 221 which establishes no short-circuit with the gate electrode 205 (a word line). This further makes it possible to respond to the microminiaturization and the high integration of semiconductor devices as well as to embody a high reliability of the memory capacitor.

(Fourth Embodiment)

Figure 11A:
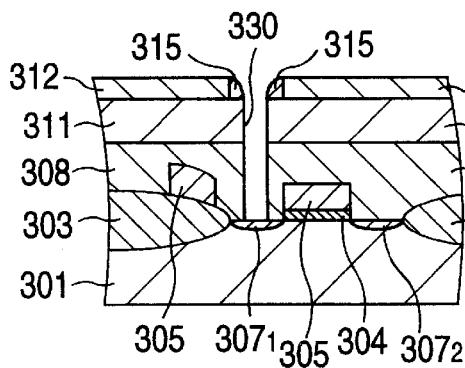
FIGS. 11A–11F are cross sectional views showing, in processing order, the method of fabricating the DRAM of COB structure which is the semiconductor storage device according to the fourth embodiment of the present invention.
Figure 11B:
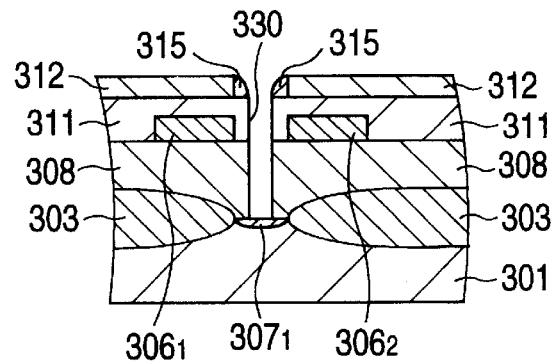

A semiconductor storage device according to a fourth embodiment of the present invention, as shown in FIGS. 11A and 11B, differs from the above-described DRAM according to the first embodiment in that a side wall 315 is formed only on a side wall face of a contact hole in a silicon nitride film 312.

Next, the description will be given below concerning a method of fabricating this DRAM, referring to FIGS. 10A–10H and 11A–11F. Incidentally, FIGS. 10A, 10C, 10E, 10G, 11A, 11C and 11E are cross sectional views along a direction perpendicular to a gate electrode (a word line), and FIGS. 10B, 10D, 10F, 10H, 11B, 11D and 11F are cross sectional views along a direction perpendicular to a bit line.

Figure 10A:
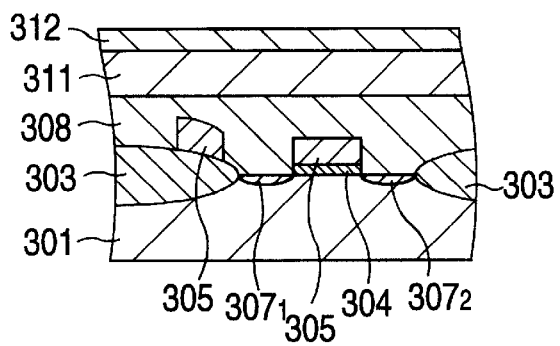
FIGS. 10A–10H are cross sectional views showing, in processing order, a method of fabricating a DRAM of COB structure which is a semiconductor storage device according to a fourth embodiment of the present invention.
Figure 10B:
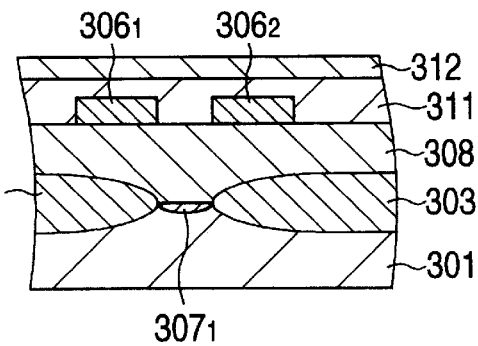

As is the case with the steps shown in FIGS. 1A–1D in the method of fabricating the DRAM according to the first embodiment, formed are a field oxide film 303, an access transistor having a gate electrode 305 (a word line) on a gate oxide film 304 and first and second impurity diffusion layers $307_1$ and $307_2$, an interlayer insulating film 308, two bit lines (first and second bit lines $306_1$ and $306_2$) and a silicon oxide film 311 (an insulating film) (cf. FIGS. 10A and 10B). A silicon nitride film 312, which is doped with an n-type impurity (for example, phosphorus) and about 10 nm to 50 nm thick, is deposited by the CVD method on the silicon oxide film 311.

Figure 10C:
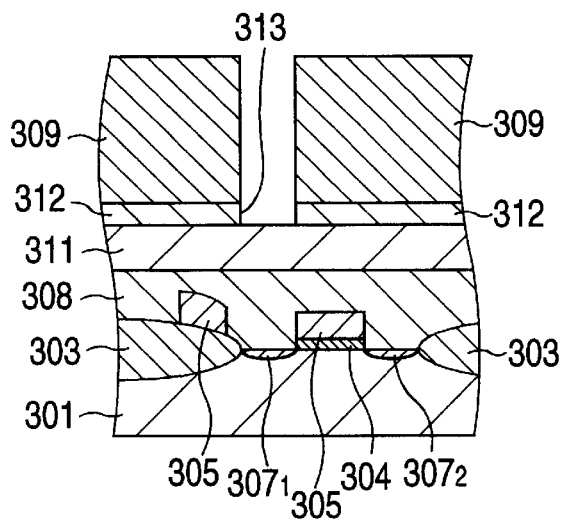
Figure 10D:
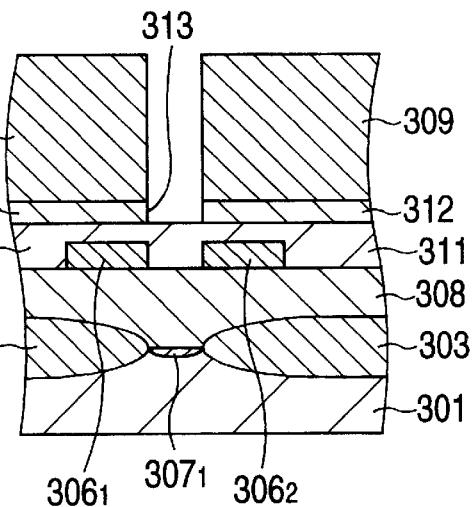

Subsequently, as shown in FIGS. 10C and 10D, after a resist mask 309 is formed on the silicon nitride film 312 by the photolithography, a dry etching of the silicon nitride film 312 is performed so as to form a contact hole 313 in the silicon nitride film 312. At this time, the diameter of the contact hole 313 is set to be a minimum dimension determined by the exposure limit in the photolithography (about 200 nm to 400 nm).

Figure 10E:
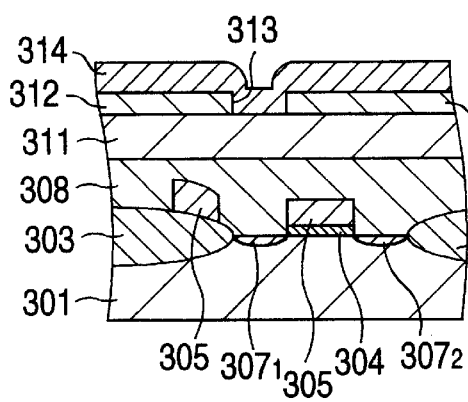
Figure 10F:
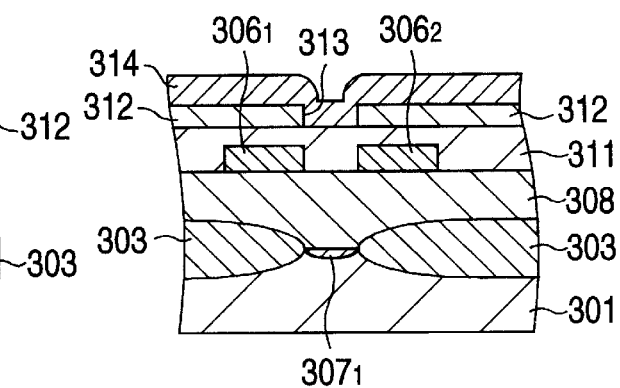
Figure 10G:
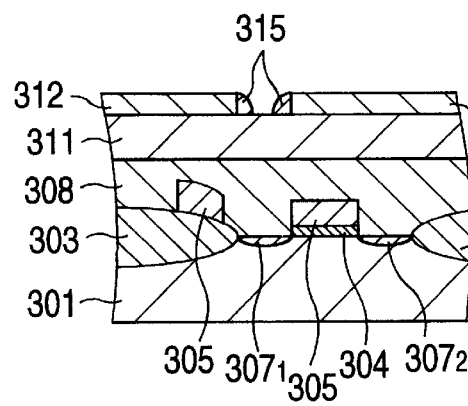
Figure 10H:
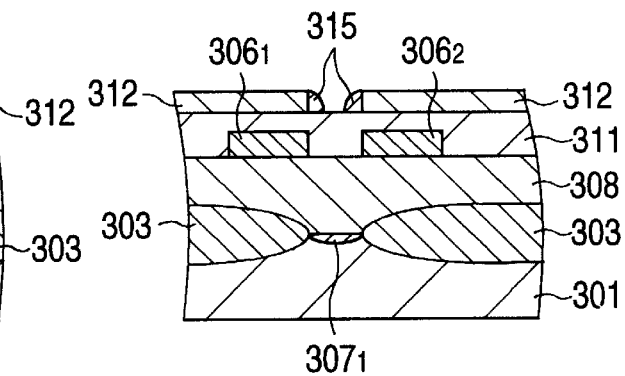

Subsequently, after the resist mask 309 is eliminated by an ashing, a polycrystal silicon film 314, as shown in FIGS. 10E and 10F, is formed on the silicon nitride film 312 so that the contact hole 313 is buried. After that, an anisotropic etching of the polycrystal silicon film 314 is performed with the silicon nitride film 312 as a stopper so as to leave the polycrystal silicon film 314 only on the side wall face of the contact hole 313, thereby forming, as shown in FIGS. 10G and 10H, a side wall 315 (an electrically conducting film) about 70 nm to 180 nm thick.

Subsequently, with the silicon nitride film 312 as a mask, in which the side wall 315 is formed on the side wall face of the contact hole 313, a dry etching of the silicon oxide film 311 and the interlayer insulating film 308 is performed so as to form, as shown in FIGS. 11A and 11B, a storage contact hole 330 for exposing a portion of the surface of the first impurity diffusion layer $307_1$ (a source). At this time, the existence of the side wall 315 makes it possible to form the storage contact hole 330 with a predetermined spacing from the side face of the gate electrode 305 or the side faces of the first and second bit lines $306_1$ and $306_2$. This makes it possible to prevent a short-circuit between the gate electrode 305 and a storage node electrode 321 (described later) accompanied by the microminiaturization of memory cells in the DRAM, or a short-circuit between the first and second bit lines $306_1$ and $306_2$ and the storage node electrode 321.

Figure 11C:
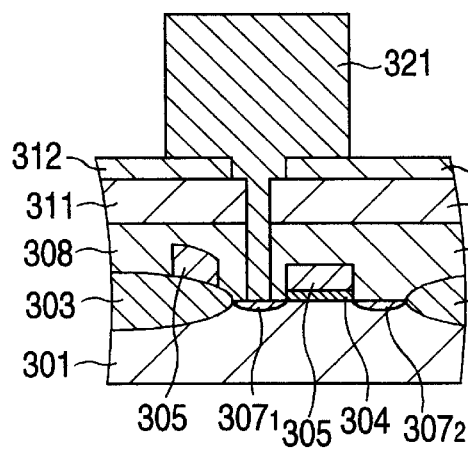
Figure 11D:
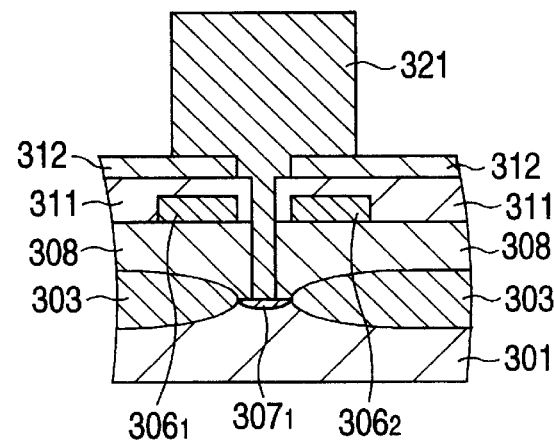

Subsequently, a polycrystal silicon film, which is doped with an n-type impurity (for example, phosphorus) and about 100 nm thick, is deposited by the CVD method on the silicon nitride film 312 so that the storage contact hole 330 is filled. After that, a photolithography for the polycrystal silicon film and a subsequent dry etching thereof are performed with the silicon nitride film 312 as a stopper, thereby, as shown in FIGS. 11C and 11D, accomplishing patterning of the polycrystal silicon film into a predetermined electrode-like shape. This forms, on the silicon nitride film 312, the island-like shaped storage node electrode 321 that is connected through the storage contact hole 330 with the first impurity diffusion layer $307_1$ functioning as a source. The side wall 315, being integrated into the storage node electrode 321, functions as a portion of the storage node electrode.

Figure 11E:
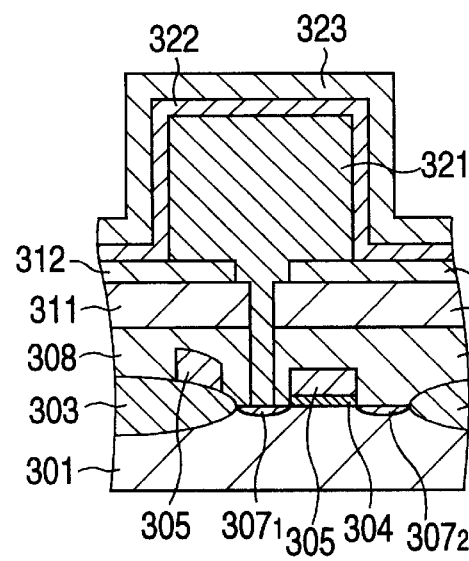
Figure 11F:
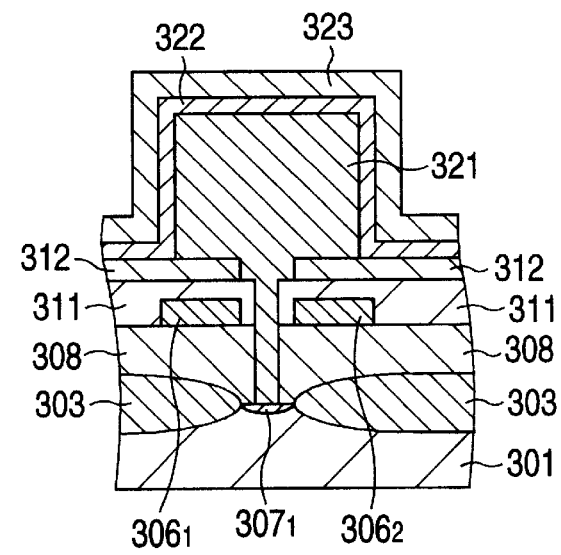

Subsequently, after a resist mask employed for the patterning is eliminated by an ashing, a silicon oxide film, a silicon nitride film and a silicon oxide film are formed one by one in such a manner as to cover the storage node electrode 321, thereby forming, as shown in FIGS. 11E and 11F, a dielectric film 322 comprising an ONO film in such a manner as to cover the surface of the storage node electrode 321. A polycrystal silicon film is formed on the dielectric film 322, thereby forming a cell plate electrode 323 opposed to the storage node electrode 321 through the dielectric film 322. This forms the memory capacitor that comprises the storage node electrode 321, the dielectric film 322 and the cell plate electrode 323.

Subsequently, the DRAM is formed through a step of forming interlayer insulating films, a step of forming vias, a step of forming interconnections and a step of forming a peripheral circuit unit in the memory cell unit, although the accompanying drawings are omitted. Incidentally, the peripheral circuit unit in the memory cell unit is generally formed together with the memory cell unit.

As described above, in the present embodiment, the side wall 315 is formed on the side wall face of the contact hole 313 which has the diameter of a minimum dimension and is formed in the silicon nitride film 312. This makes it possible to make the substantial diameter of the storage contact hole 330 smaller than a minimum dimension determined by the exposure limit. As a result, it becomes possible to ensure sufficient insulation between the storage node electrode 321 and the gate electrode 305, and sufficient insulation between the storage node electrode 321 and the first and second bit lines $306_1$ and $306_2$.

Accordingly, the present embodiment allows enough alignment leeway to be ensured in the photolithography, thus making it possible to embody formation of the storage node electrode 321 which establishes no short-circuit with the gate electrode 305 (a word line) or the first and second bit lines $306_1$ and $306_2$. This further makes it possible to respond to the microminiaturization and the high integration of semiconductor devices as well as to embody a high reliability of the memory capacitor.

(Other Embodiments)
(1) A DRAM Having a Field-Shield Device Isolation Structure

Figure 12A:
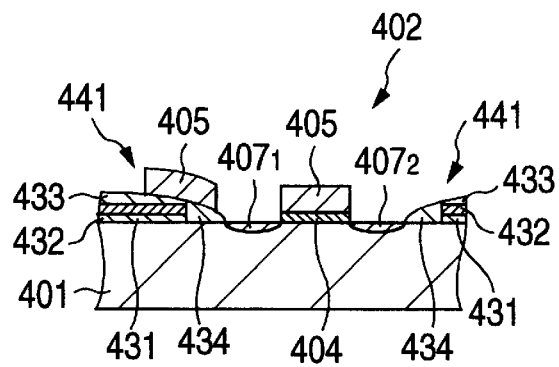
FIGS. 12A and 12B are cross sectional views showing a field-shield device isolation structure of a DRAM which is a semiconductor storage device according to another embodiment of the present invention.
Figure 12B:
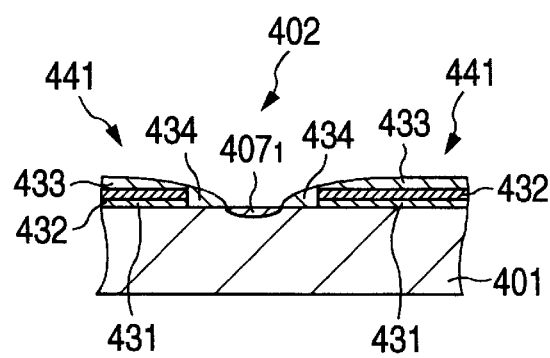

Although each of the DRAMs according to the above-described first to fourth embodiments has the device isolation structure in which the field oxide film is employed, it is allowable to employ a field-shield device isolation structure 441 as shown in FIGS. 12A and 12B. In the field-shield device isolation structure 441, after a field-shield gate oxide film 431 is formed on a silicon semiconductor substrate 401, a shield plate electrode 432, which comprises a polycrystal silicon film, and a cap insulating film 433 are formed on the field-shield gate oxide film 431 by patterning. After that, a side wall 434 is formed on the side faces of the shield plate electrode 432 and cap insulating film 433, thereby burying the shield plate electrode 432 in an insulating film (for example, an oxide film).

The field-shield device isolation structure 441 makes it possible to perform device isolation by fixing a lower part of the shield plate electrode 432 over the semiconductor substrate 401 at a predetermined electric potential, and thus makes a contribution to an even further microminiaturization of semiconductor devices (cf. JP-A-8-31928).

Figure 13A:
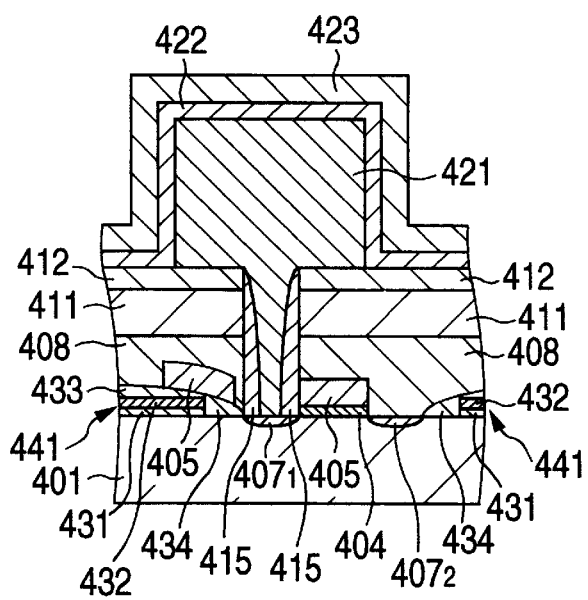
FIGS. 13A and 13B are cross sectional views showing a DRAM of field-shield device isolation structure which is a semiconductor storage device according to another embodiment of the present invention.
Figure 13B:
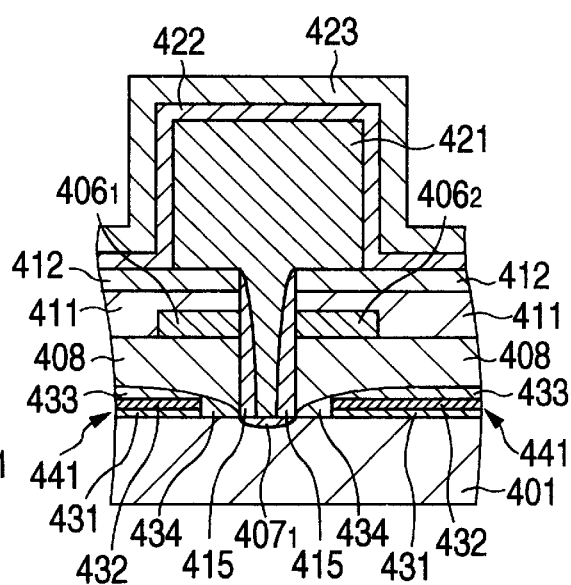

Incidentally, FIGS. 13A and 13B show diagrams corresponding to FIGS. 3C and 3D at the time of employing the field-shield device isolation structure 441 in the above-described DRAM according to the first embodiment.

(2) A DRAM Having a Trench Type Device Isolation Structure

Figure 14A:
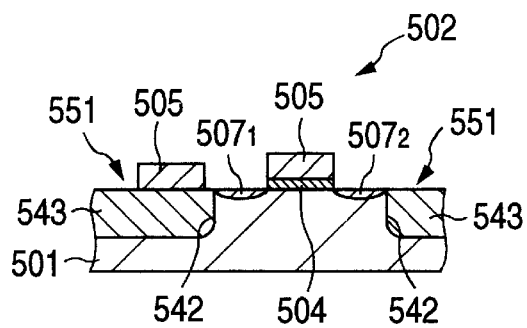
FIGS. 14A and 14B are cross sectional views showing a trench type device isolation structure of a DRAM which is a semiconductor storage device according to still another embodiment of the present invention.
Figure 14B:
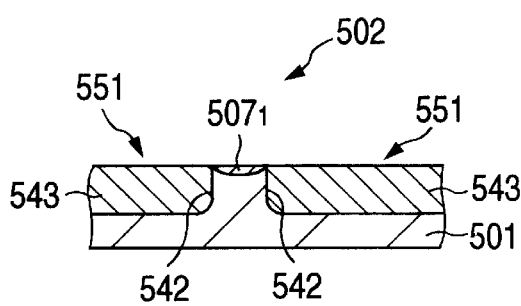

Although each of the DRAMs according to the above-described first to fourth embodiments has the device isolation structure in which the field oxide film is employed, it is allowable to employ a trench type device isolation structure (STI: Shallow Trench Isolation) 551 as shown in FIGS. 14A and 14B. In the trench type device isolation structure 551, after a groove 542 is formed at a device isolation region in a silicon semiconductor substrate 501, the groove 542 is filled with a device isolating insulating film 543 such as a silicon oxide film. The trench type device isolation structure 551 also makes a contribution to the even further microminiaturization of semiconductor devices (cf. JP-A-4-303942).

Figure 15A:
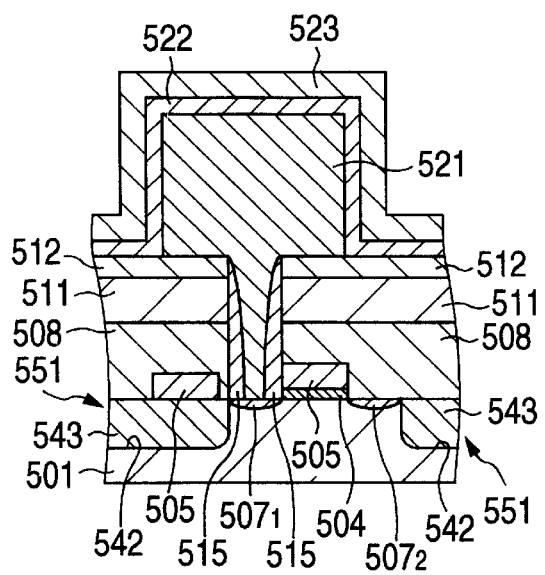
FIGS. 15A and 15B are cross sectional views showing a DRAM of trench type device isolation structure which is a semiconductor storage device according to still another embodiment of the present invention.
Figure 15B:
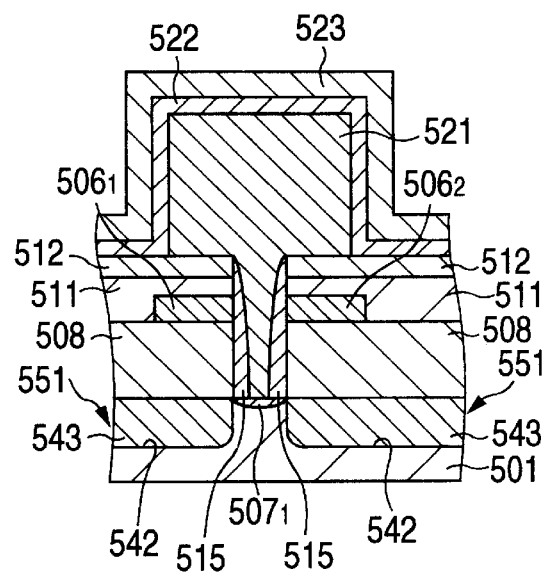

Incidentally, FIGS. 15A and 15B show diagrams corresponding to FIGS. 3C and 3D at the time of employing the trench type device isolation structure 551 in the above-described DRAM according to the first embodiment.

What is claimed is:

1. A semiconductor storage device, comprising:
   a semiconductor substrate having a device activation region defined by a device isolation structure;
   an access transistor formed at said device activation region in said semiconductor substrate, and having a gate electrode and a pair of impurity diffusion layers;
   a first insulating film formed over said access transistor, and having a first contact hole for exposing a portion of a surface of one of said pair of impurity diffusion layers;
   a protective film formed on said first insulating film, and having a second contact hole formed on said first contact hole;
   a second insulating film formed on a side wall face of said first contact hole in said first insulating film and on a side wall face of said second contact hole in said protective film; and
   a memory capacitor in which a lower electrode and an upper electrode are opposed to each other and capacitive-coupled through a dielectric film, wherein said lower electrode of said memory capacitor is filled inside said first and second contact holes to be formed in an mushroom-shaped shape on said first insulating film through said protective film so as to be electrically connected with the one of said pair of impurity diffusion layers.

2. A semiconductor storage device as claimed in claim 1, wherein each of said first and second contact holes has a diameter of a minimum dimension determined by an exposure limit in a photolithography.

3. A semiconductor storage device as claimed in claim 1, wherein each of said lower and upper electrodes of said memory capacitor is made of a polycrystal silicon film.

4. A semiconductor storage device as claimed in claim 1, wherein said protective film is a silicon nitride film.

5. A semiconductor storage device as claimed in claim 1, wherein said protective film is a polycrystal silicon film, and is formed only between said island-like shaped lower electrode and said first insulating film.

6. A semiconductor storage device as claimed in claim 1, further comprising a bit line formed under said lower electrode of said memory capacitor and in proximity to the side wall face of said first contact hole, wherein said lower electrode is insulated from said bit line by said second insulating film.

7. A semiconductor storage device as claimed in claim 1, wherein said gate electrode of said access transistor is formed under said lower electrode of said memory capacitor and in proximity to the side wall face of said first contact hole; and said lower electrode is insulated from said gate electrode by said second insulating film.

8. A semiconductor storage device as claimed in claim 1, wherein said device isolation structure is a field oxide film which is formed by LOCOS method.

9. A semiconductor storage device as claimed in claim 1, wherein said device isolation structure is a trench type device isolation structure in which an insulating film is formed in a groove which is formed in said semiconductor substrate.

10. A semiconductor storage device, comprising:

a semiconductor substrate having a device activation region defined by a device isolation structure;

an access transistor formed at said device activation region in said semiconductor substrate, and having a gate electrode and a pair of impurity diffusion layers;

a first insulating film formed over said access transistor, and having a contact hole for exposing a portion of a surface of one of said pair of impurity diffusion layers;

a second insulating film formed on a side wall face of said contact hole in said first insulating film in such a manner as to protrude from said contact hole; and a memory capacitor in which a lower electrode and an upper electrode are opposed to each other and capacitive-coupled through a dielectric film, wherein said lower electrode of said memory capacitor is filled inside said contact hole through said second insulating film to be formed in an mushroom-shaped shape on said first insulating film so as to be electrically connected with the one of said pair of impurity diffusion layers.

11. A semiconductor storage device as claimed in claim 10, wherein said contact hole has a diameter of a minimum dimension determined by an exposure limit in a photolithography.

12. A semiconductor storage device as claimed in claim 10, wherein each of said lower and upper electrodes of said memory capacitor is made of a polycrystal silicon film.

\* \* \* \* \*